(12) United States Patent
Ker et al.

(10) Patent No.: US 6,750,517 B1
(45) Date of Patent: Jun. 15, 2004

(54) DEVICE LAYOUT TO IMPROVE ESD ROBUSTNESS IN DEEP SUBMICRON CMOS TECHNOLOGY

(75) Inventors: Ming-Dou Ker, Hsinchu (TW); Mau-Lin Wu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/706,206

(22) Filed: Nov. 6, 2000

(51) Int. Cl.$^7$ .......................... H01L 29/76; H01L 23/62
(52) U.S. Cl. ........................ 257/401; 257/355; 257/357
(58) Field of Search ........................ 257/401, 355–363

(56) References Cited

U.S. PATENT DOCUMENTS

| | | | | |
|---|---|---|---|---|
| 4,661,726 A | * | 4/1987 | Biard | 307/450 |
| 5,329,143 A | | 7/1994 | Chan et al. | 257/173 |
| 5,404,041 A | | 4/1995 | Diaz et al. | 257/360 |
| 5,468,667 A | | 11/1995 | Diaz et al. | 437/50 |
| 5,616,943 A | | 4/1997 | Nguyen et al. | 257/355 |
| 5,714,784 A | | 2/1998 | Ker et al. | 257/360 |
| 5,811,856 A | | 9/1998 | Lee | 257/355 |
| 5,831,316 A | | 11/1998 | Yu et al. | 257/401 |
| 5,838,050 A | | 11/1998 | Ker et al. | 257/401 |
| 5,852,315 A | | 12/1998 | Ker et al. | 257/355 |
| 5,977,595 A | * | 11/1999 | Ham | 257/358 |
| 6,204,542 B1 | * | 3/2001 | Kinoshita et al. | 257/401 |
| 6,445,215 B1 | * | 9/2002 | Takahashi et al. | 326/105 |

FOREIGN PATENT DOCUMENTS

| | | | | |
|---|---|---|---|---|
| FR | 2617642 A | * | 1/1989 | 257/357 |
| JP | 3-73574 | * | 3/1991 | H01L/29/784 |

OTHER PUBLICATIONS

"Area–Efficient Layout Design for CMOS Output Transistors", M.D. Ker et al., IEEE Transactions on Electron Devices, vol. 44, No. 4, Apr. 1977, pp. 635–645.
"ESD Protection for Output Pad with Well–Coupled Field––Oxide Device in 0.5–um CMOS Technology", C.N. Wu et al., IEEE Transactions on Electron Devices, vol. 44, No. 3, Mar. 1997, pp. 503–505.
"The Behavior of Very High Current Density Power MOSFET's", J. Evans et al., IEEE Transactions on Electron Devices, vol. 44, No. 7, Jul. 1997, pp. 1148–1153.

* cited by examiner

*Primary Examiner*—Ori Nadav
(74) *Attorney, Agent, or Firm*—George O. Saile; Stephen B. Ackerman; Graham S. Jones, II

(57) ABSTRACT

A layout form ESD-protection MOS transistors include gate electrodes of the ESD-protection MOS transistors being formed with wider ends at the periphery of the active region, whereby the transistors have improved turn-on uniformity. The ESD protection transistors are NMOS and PMOS. The source contacts and drain contacts for transistors are located inboard of the periphery of the active region leaving space for the wider ends of the gate electrodes. The wider ends of the gate electrodes straddle the peripheral boundaries of the active region. A modified layout style is provided for stacked NMOS and PMOS devices in the high-voltage-tolerant I/O circuits with the wider ends being provided on only the inner transistors.

23 Claims, 14 Drawing Sheets

DEVICE LAYOUT TO IMPROVE ESD ROBUSTNESS IN DEEP SUBMICRON CMOS TECHNOLOGY

BACKGROUND OF THE INVENTION

1. Field of the Invention

This invention relates to ESD protection circuits and more particularly to designs for minimizing damage at drain contacts around the ends of the MOS multiple fingers.

2. Description of Related Art

In the design of ESD protection circuits, grounded-gate MOS devices are usually used as the ESD protection devices to bypass the ESD current when ESD overstress is applied to the I/O pins of an IC. For sustaining a large ESD current the channel width of the protection MOS transistor should be large enough. With a large device dimension, the ESD MOS transistors are traditionally implemented with multiple fingers to bypass the ESD current efficiently.

However ESD damaged areas caused by contact spiking are often located at the drain contacts around the two ends of the multiple drain fingers is more serious in machine model ESD tests due to the faster rise time and the larger current of the ESD pulse.

A schematic diagram of a popular input ESD protection circuit is shown in FIG. 1, which is used to bypass the ESD overstress from the I/O pins to VDD/VSS power rails. In this design, a PMOS transistor ($M_p$) with large channel width is connected between the VDD power rail and the PAD. The gate of the PMOS transistor is connected to VDD power rail through a resistor $R_p$. PMOS transistor $M_p$ is turned off during the normal operating condition. Resistor $R_p$ is used to prevent the gate oxide breakdown of transistor $M_p$ in an ESD overstress condition. The parasitic lateral p-n-p Bipolar Junction Transistor (BJT) of transistor $M_p$ is also shown in FIG. 1. The source and drain P+ diffusions of transistor $M_p$ are the emitter and collector of the BJT, respectively. The base of the BJT is formed by the N-well and is connected to VDD power line through the parasitic N-well resistance $R_w$. The parasitic lateral p-n-p BJT is used to bypass the ESD current when ESD overstress is across PAD and VDD node. An NMOS transistor ($M_N$) with large channel width is used to bypass the ESD current when ESD overstress is across PAD and VSS node. The gate of the NMOS transistor is connected to VSS power rail through a resistor $R_N$. $M_N$ is turned off during the normal operating condition. $R_N$ is used to prevent the gate oxide breakdown of $M_N$ in ESD overstress condition. The parasitic lateral n-p-n BJT of $M_N$ is shown in the figure, too. The source and drain N+ diffusions of $M_N$ are the emitter and collector of the BJT, respectively. The base of the BJT is formed by the p-substrate and is connected to VSS power line through the parasitic substrate resistance $R_{sub}$.

For implementing the PMOS transistor $M_p$ and NMOS transistor $M_N$ in FIG. 1 with large channel width, the multiple-finger layout style is usually applied in such ESD protection devices.

The multiple-finger layout style of an ESD-protection NMOS transistor device is drawn in FIG. 2. The parameters of layout geometry should be designed appropriately to improve the ESD level of ESD-protection device. For example, the distance of drain contact to polysilicon-gate edge and the distance of source contact to polysilicon-gate edge are two important layout parameters.

These two parameters are termed as 'd' and 's' in FIG. 2, respectively. The symmetric layout on the multiple fingers of the MOS transistor is very important for the turn-on uniformity of these fingers during ESD stress.

Recently, there were several layout approaches proposed to improve the ESD robustness of the ESD-protection devices [1–8]. Different layout styles of a same ESD-protection device will perform different ESD robustness. The ESD performance is very strongly dependent on layout. Therefore, improving ESD performance through appropriate layout style is very important for ESD design. FIG. 3 is a layout technique reported in [2] [4] to improve the ESD robustness of the ESD-protection device. In this implementation, the P+ pick-up with contacts are inserted between the source sides of two neighboring NMOS transistor fingers. These P+ pick-up are connected to VSS power rail through the contacts. In this implementation, the substrate resistance, $R_{sub}$, of each MOS transistor finger is nearly the same, therefore the turn-on uniformity among the MOS multiple fingers can be improved. This is an example of improving ESD performance by layout technique.

But, there are still some problems in the traditional multiple-finger layout style. The traditional finger-type layout for NMOS is illustrated in FIG. 2. Its cross-sectional view along the line 4–4' in FIG. 2 is shown in FIG. 4, which is demonstrated in a p-substrate bulk CMOS process. There are two important ESD-related spacings in this traditional finger-type layout, which are 'd' and 's' as we mentioned previously.

Except these two parameters, another important ESD-related spacing, denoted as 'G0' in FIG. 2, often degrades ESD robustness of CMOS I/O circuits.

FIG. 5 is a schematic cross-sectional view along the line 5–5' in FIG. 2 prior art device showing the ESD peak-discharging effect of the finger's end of the finger-type layout. FIG. 5 includes a plot for explaining the 'G0' spacing. In FIG. 5, there exists a parasitic diode $D_1$, between the P+ diffusion and the N+ diffusion of the drain. The spacing from the edge of p+ diffusion to the edge of drain N+ diffusion is termed as 'G0'. If this spacing is smaller than that from the drain contact to its source contact, the diode $D_1$ will be first broken down due to the ESD peak-discharging effect before the NMOS drain is broken down. Even if the spacing 'G0' is larger than the spacing 'd' in the finger-type NMOS device, the ESD hot spot may still occurs at the drain edge due to the peak structure at the end of the finger of the finger-type layout. This phenomenon occurs often in the machine-model (MM) ESD test. The machine-model ESD stress of 200V has a higher and faster ESD current than that of the human-body-model (HBM) ESD stress of 2000V. In the fast ESD transition, not only the spacing effect but also the peak-discharging effect can cause the ESD damage located on the end of the drain finger.

For solving the problems of finger-type layout mentioned above, some other different layout styles of the ESD protection device were proposed to improve the ESD robustness [6–8]. The square-type [6], hexagon-type [7], and octagonal-type [8] layouts were used to drawn the ESD protection devices. The square-type layout style, which is used to realize the MOS device [6], is plotted in FIG. 6. In FIG. 6, there are four small-dimension square cells to form a large-dimension NMOS device. The polysilicon gate in each square cell is drawn in a square ring. The contacts at the source region are placed in a square-type arrangement. Outside the NMOS device, there are double guard rings. All the layout elements in a square cell, including the contacts, have to be placed as symmetrically as possible to ensure uniform ESD current flow in the NMOS device to increase its ESD reliability. By using the square-type layout design, there is no 'G0' spacing in the square-type output transistors. Moreover, no parasitic diode directly closes to the drain edge in the square-type layout, so the ESD robustness of output transistors is not degraded by the ESD peak-discharging effect as shown in FIG. 5 with the traditional finger-type layout. By the square-type layout proposed in [6], the layout area of CMOS output transistors can be effectively reduced but the driving capability is higher and the ESD reliability is better. Because the output transistors realized by more symmetrical device structures, the transistors can be more uniformly triggered during the ESD-stress events. This is another example of improving ESD robustness by modifying layout style of the ESD protection device.

Although some approaches had been proposed to improve the turn-on uniformity of different MOS fingers, the uniformity problem exists in a single MOS finger. FIG. 7 shows the parasitic lateral n-p-n BJT devices of the multiple-finger NMOS transistors. The lateral n-p-n BJT of each NMOS transistor finger can be viewed as the combination of several parallel lateral n-p-n BJT devices, $Q_1, \ldots, Q_j, \ldots,$ and $Q_N$, which is shown in FIG. 7. N is the number of drain contacts in single column in the layout. $Q_1$ and $Q_N$ are the BJT devices at the two ends of the polysilicon-gate. For each BJT, the base of the BJT is connected to ground through the substrate resistors. Bases of $Q_1$, $Q_j$, and $Q_N$ are connected to ground through $R_1$, $R_j$, and $R_N$, respectively. For the layout style shown in FIG. 7, the characteristics of $Q_1$, $Q_j$, and $Q_N$ are not the same to each other. There exist peak structures in $Q_1$ and $Q_N$ in the traditional finger-type layout, which is demonstrated in FIG. 5. The ESD peak-discharging effect can degrade the ESD robustness of the finger-type MOS transistors. Therefore, ESD damages are often found at the end of the finger, which are shown in FIG. 7. This is the non-uniformity problem existing within one finger of MOS transistor. The damage at the ends of the finger degrades its ESD level in the machine model ESD test. The rise time of the machine model ESD event is much faster than that of the human body model, and the current of machine model ESD event is larger than that of human body model. Before the other BJT devices are turned on, the ESD damages at the end of the finger have occurred.

The illustration of the peak-discharging effect on the finger-type MOS transistor is shown in FIG. 8. The distribution of the ESD current path is shown in this figure. For the positions of 'a', 'b', 'c', and 'd', the current paths are different from others. They have more current paths and therefore the induced substrate current is more than that of others. The parasitic BJT devices at these positions will be triggered on faster than others. In deep-submicron CMOS technology, a lot of damage samples were found at the ends of the MOS finger after MM ESD test. Therefore, the non-uniformity problem in a single MOS finger causes the degradation on its ESD robustness, even if the MOS has a large device dimension.

Patents cited below describe the features as follows: a method [1] of placing source contacts for efficient ESD/EOS protection in grounded substrate MOS integrated circuits; source contact placement [2] for efficient ESD/EOS protection in grounded substrate MOS integrated circuit; an ESD protection circuit [3] employing a lateral NPN transistor to provide a low resistance discharge path for ESD currents; a layout [4] for an ESD input-protection circuit; a multi-finger MOS transistor element [5] where all base resistances of each finger are equal; an ESD device [6] having a square layout style to realize the MOS device; a hexagonally shaped CMOS device [7] constructed for an ESD protection device; an N-sided polygonal cell layout [8] for a multiple cell transistor constructed for use in an ESD protection circuit; an ESD protection circuit [9] for use with mixed voltages in integrated circuits. Several publications [10, 11, 12] discuss the layout of CMOS transistors to provide uniform current density in high current applications such as ESD events.

References

[1] C. H. Diaz, C. Duvvury, and S.-M. Kang, "Method of placing source contacts for efficient ESD/EOS protection in grounded substrate MOS integrated circuit," U.S. Pat. No. 5,468,667, 1995.

[2] C. H. Diaz, C. Duvvury, and S.-M. Kang, "Source contact placement for efficient ESD/EOS protection in grounded substrate MOS integrated circuit," U.S. Pat. No. 5,404,041, 1995.

[3] T. C. Chen, and D. S. Culver, "ESD protection circuit," U.S. Pat. No. 5,329,143, 1994.

[4] J.-H. Lee, "Layout of ESD input-protection circuit," U.S. Pat. No. 5,811,856, 1998.

[5] T.-L. Yu, and K. Young, "Multi-finger MOS transistor element," U.S. Pat. No. 5,831,316, 1998.

[6] M.-D. Ker, C.-Y. Wu, C.-C. Huang, C.-N. Wu, and T.-L. Yu, "Electrostatic discharge protection device," U.S. Pat. No. 5,714,784, 1998.

[7] M.-D. Ker, C.-Y. Wu, C.-C. Huang, C.-N. Wu, and T.-L. Yu, "Hexagon CMOS device," U.S. Pat. No. 5,838,050, 1998.

[8] M.-D. Ker, T.-S. Wu, and K.-F. Wang, "N-sided polygonal cell layout for multiple cell transistor," U.S. Pat. No. 5,852,315, 1998.

[9] H. P. Nguyen and J. D. Walker, "Electrostatic Discharge Protection System for Mixed Voltage Application Specific Integrated Circuit Design", U.S. Pat. No. 5,616,943, 1997.

[10] "Area-Efficient Layout Design for CMOS Output Transistors", M.-D. Ker, C.-Y. Wu, and T.-S. Wu, IEEE Transactions On Electron Devices, VOL. 44, NO.4, APRIL 1997, pp. 635–645.

[11] "ESD Protection for Output Pad with Well-Coupled Field-Oxide Device in 0.5-pm CMOS Technology", C.-N. Wu, and M.-D. Ker, IEEE Transactions on Electron Devices, VOL. 44, NO.3, MARCH 1997, pp. 503–505.

[12] "The Behavior of Very High Current Density Power MOSFET's", G. Evans and G. Amaratunga, IEEE Transactions On Electron Devices, VOL. 44, NO.7, JULY 1997, pp. 1148–1153.

SUMMARY OF THE INVENTION

In accordance with this invention, a new layout style is employed to reduce the probability of damage at drain contacts around the ends of the MOS multiple fingers. Therefore the layout area can be more compact to save silicon cost.

By applying this invention on the layout of ESD protection circuit, the ESD level can be improved significantly, especially in the machine model ESD event.

In this invention, the ESD protection circuit with a novel layout style improves the turn-on uniformity of MOS transistor finger. By improving the turn-on uniformity of the MOS transistor finger, the ESD robustness of the ESD protection circuit can be improved. The layout style and application of this invention in the 3V/5V tolerant I/O circuits are also presented in this document.

A method in accordance with this invention comprises forming a layout for ESD-protection MOS transistors including forming gate electrodes of the ESD-protection MOS transistors which are formed with wider ends at the periphery of the active region, whereby the transistors have improved turn-on uniformity. Alternatively the ESD-protection MOS transistors are formed with asymmetric wider ends at the periphery of the active region whereby the transistors have improved turn-on uniformity.

Preferably, the ESD protection transistors are NMOS and PMOS.

Preferably, source contacts and drain contacts for transistors are located inboard of the periphery of the active region leaving space for the wider ends of the gate electrodes.

Preferably, the wider ends of the gate electrodes straddle the peripheral boundaries of the active region.

Preferably, the modified layout style is provided for stacked NMOS and PMOS devices in the high-voltage-tolerant I/O circuits with the wider ends being provided on only the top device.

A layout of ESD-protection MOS transistors in accordance with another aspect of this invention, comprises gate electrodes of the ESD-protection MOS transistors being formed with wider ends or alternatively with asymmetric wider ends at the periphery of the active region, whereby the transistors have improved turn-on uniformity.

Preferably, the ESD protection transistors are NMOS and PMOS.

Preferably, source contacts and drain contacts for transistors are located inboard of the periphery of the active region leaving space for the wider ends of the gate electrodes.

Preferably, the wider ends of the gate electrodes straddle the peripheral boundaries of the active region.

Preferably, the layout style is provided for stacked NMOS and PMOS devices in the high-voltage-tolerant I/O circuits with the wider ends being provided on only the top device.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

In this invention, a new layout style reduces the probability of damage at drain contacts around the ends of the MOS multiple fingers. Therefore the layout area can be more compact to save silicon cost By applying this invention to the layout of ESD protection circuits, the ESD level can be improved significantly.

A. Modified Layout of Poly-Gate in Multiple-finger ESD-Protection MOS Transistor There exist peak structures in the traditional finger-type layout of ESD-protection MOS transistors. The peak-discharging effect can degrade the ESD performance of the protection circuit. The effect is more serious in machine model ESD test due to the fast rise time and large current of the machine-model ESD stress. Our new layout style for the polysilicon-gate is adapted to eliminate the peak structure in finger-type MOS transistors.

Figure 9:
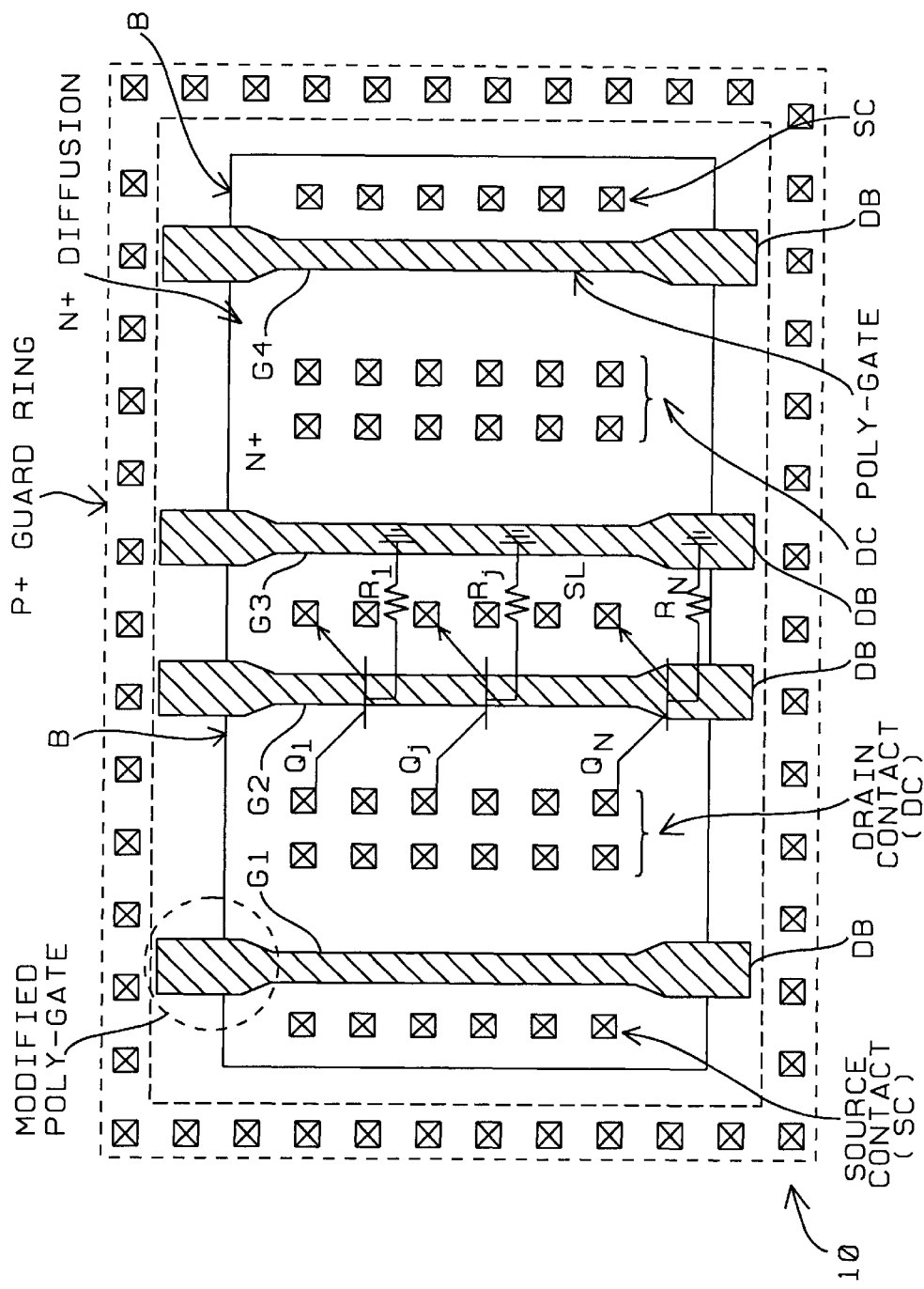
FIG. 9 shows a layout style of a device with a plurality of polysilicon-gates of NMOS transistors designed in accordance with this invention.

FIG. 9 shows a layout style of a device 10 with a plurality of polysilicon-'gates G1, G2, G3 and G4 of NMOS transistors designed in accordance with this invention. As we can see in FIG. 9, the layout of the polysilicon-gates G1, G2, G3 and G4 has "dog-bone" style ends or terminals DB. That is to say that the distal ends DB of the polysilicon-gates G1, G2, G3 and G4 near the edges of the N+ diffusion, the polysilicon-gates G1, G2, G3 and G4 are extended (widened) from the original narrow size (narrow, width) to a larger size (greater width), which means the channel length of the transistors (not shown) at the ends of the polysilicon-gates are larger (wider) than the transistors in the middle region of the polysilicon-gates G1, G2, G3 and G4. Note that the widened dog-bone distal ends DB straddle the border B of N+ diffusion in the substrate. Drain contacts DC are in double rows parallel to the gates G1–G4 between the gates G1 and G2 on the left and between the gates G3 and G4 on the right. The source contacts SC are located to the left of gate G1, located between gates G2 and G3 and located to the right of gate G4.

A set of parasitic lateral n-p-n BJT devices are also plotted in FIG. 9 for illustration of the operation mechanism of device 10. For ease of illustration but without loss of generality, the parasitic BJT devices $Q_1$, $Q_j$, and $Q_N$ of only one transistor are plotted in FIG. 9. The BJT devices $Q_1$, $Q_j$, and $Q_N$ are the parasitic lateral n-p-n BJT devices of the NMOS transistors (not shown). The base nodes of the BJT devices $Q_1$, $Q_j$, and $Q_N$ are connected to ground through a set of substrate resistors, $R_1$, $R_j$, and $R_N$, respectively between gate G2 and gate G3. Note that BJT device $Q_j$ is formed on the narrow portions of gates G2 and G3 and the BJT devices $Q_1$ and $Q_N$ are formed on the wider portions of gates G2 and G3.

Because the channel length of the polysilicon-gates G1, G2, G3 and G4 at the widened dog-bone distal ends of the polysilicon-gates G1, G2, G3 and G4 are wider than those of others, the base width of the parasitic lateral BJT is larger (wider) than others. With a wider base width, the lateral n-p-n BJT has a lower β gain and a slower turn-on speed. In this condition, the current which flows from the drain contacts DC to the diffusion edge is reduced. Therefore, the peak-discharging effect is reduced and the ESD performance improves as a result of this layout style.

Figure 1:
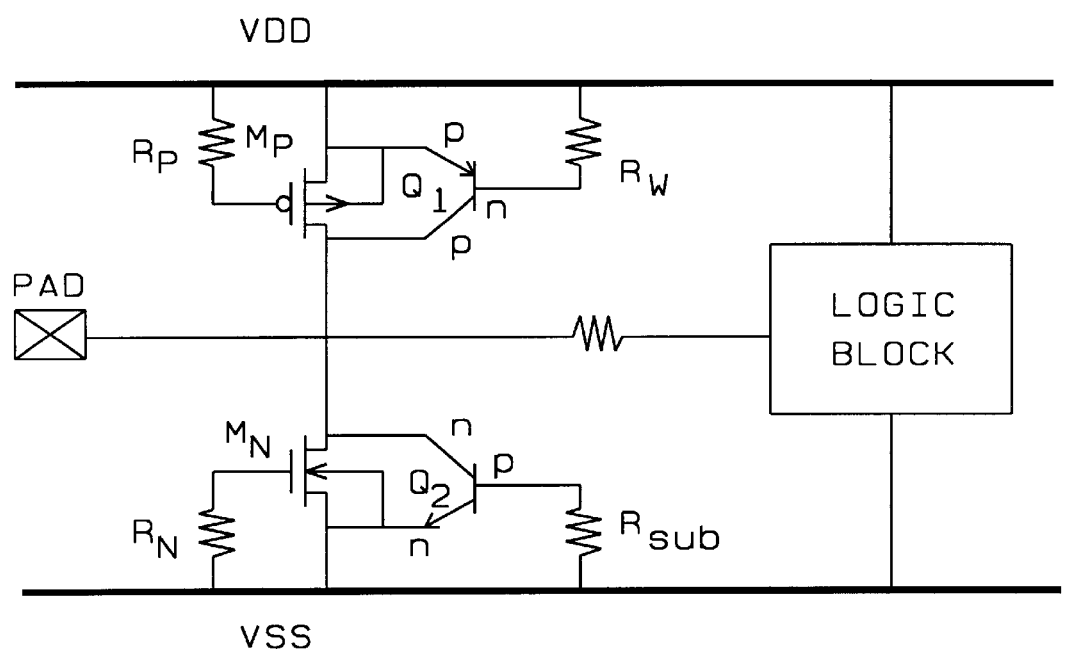
FIG. 1 is a schematic diagram of an input ESD protection circuit.
Figure 2:
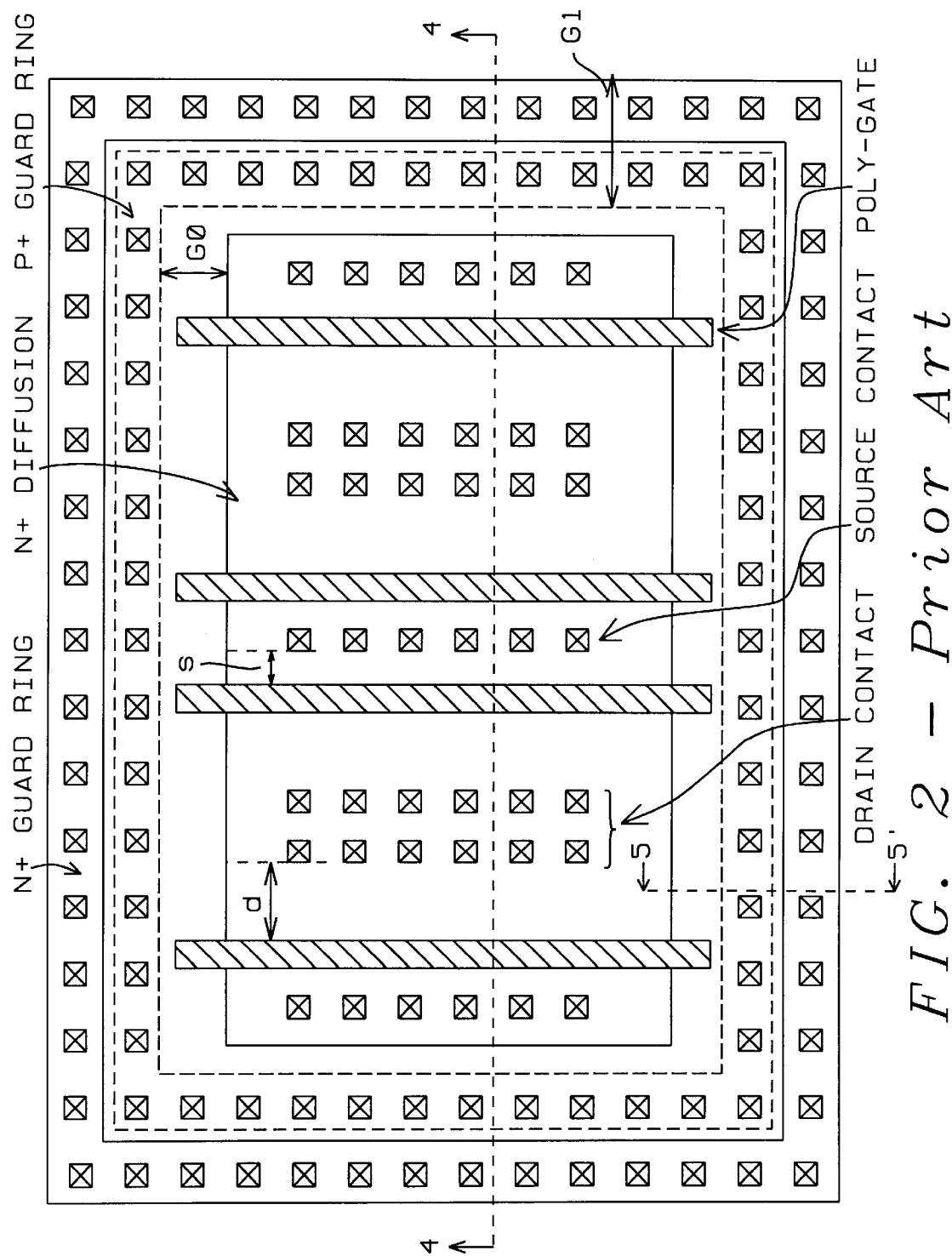
FIG. 2 shows a drawing of a prior art layout realization of a multiple-finger layout style of ESD-protection NMOS transistor device.
Figure 3:
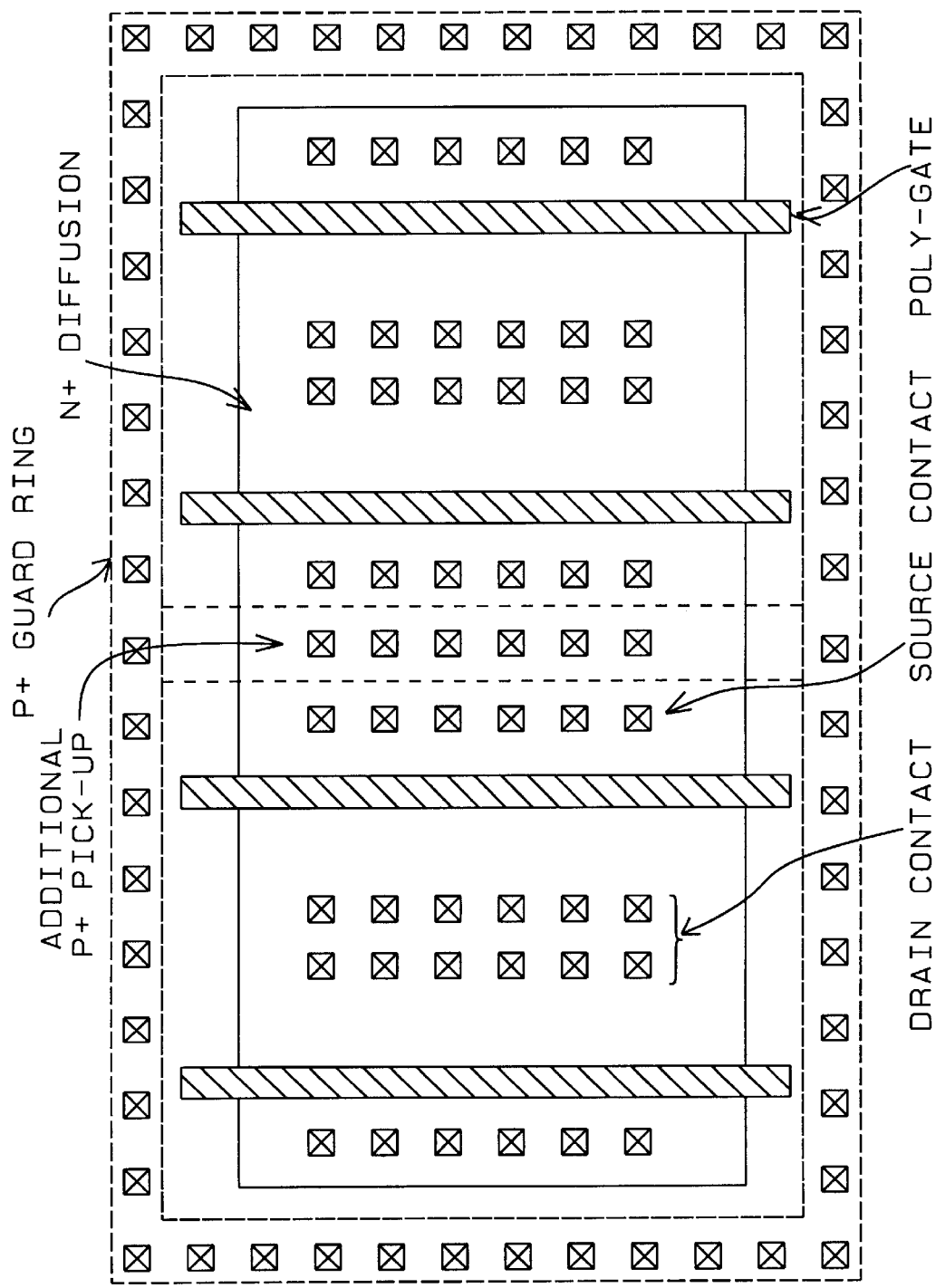
FIG. 3 illustrates a prior art technique for forming a layout of an ESD-protection NMOS device with multiple fingers and an additional P+ pick-up designed to improve the ESD robustness of a prior art device.
Figure 4:
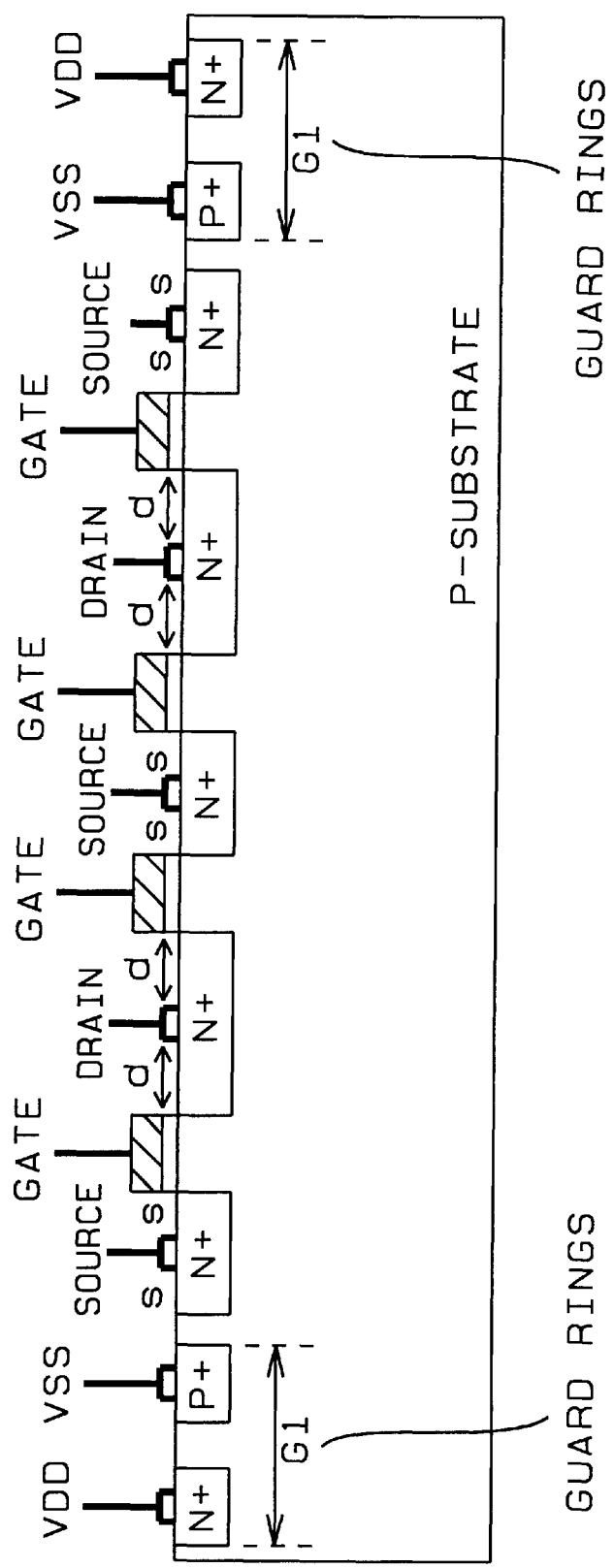
FIG. 4 shows a cross-sectional view along the line 4–4' in FIG. 2 demonstrated using a p-substrate bulk CMOS process for a prior art device.
Figure 5:
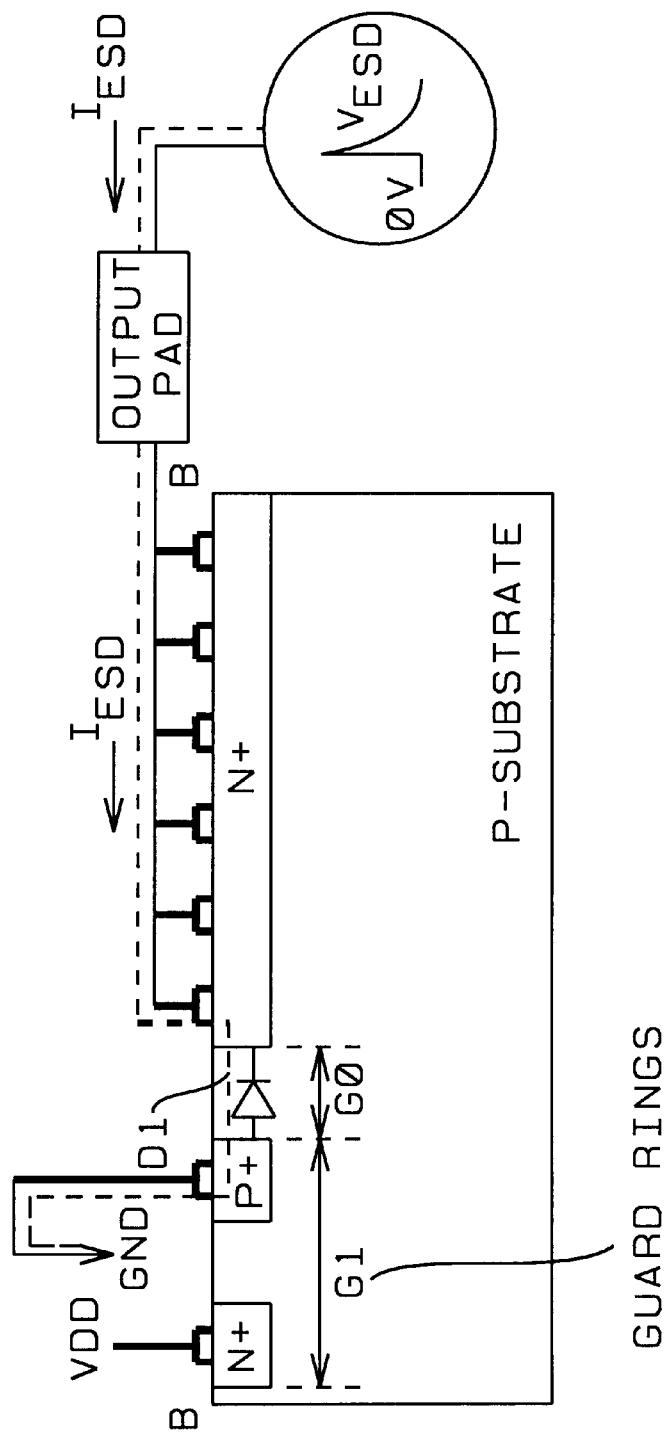
FIG. 5 is a schematic cross-sectional view along the line 5–5' in FIG. 2 which is provided for explanation of the 'G0' spacing of the prior art device and the ESD peak-discharging effect of the finger's end of the finger-type layout.
Figure 6:
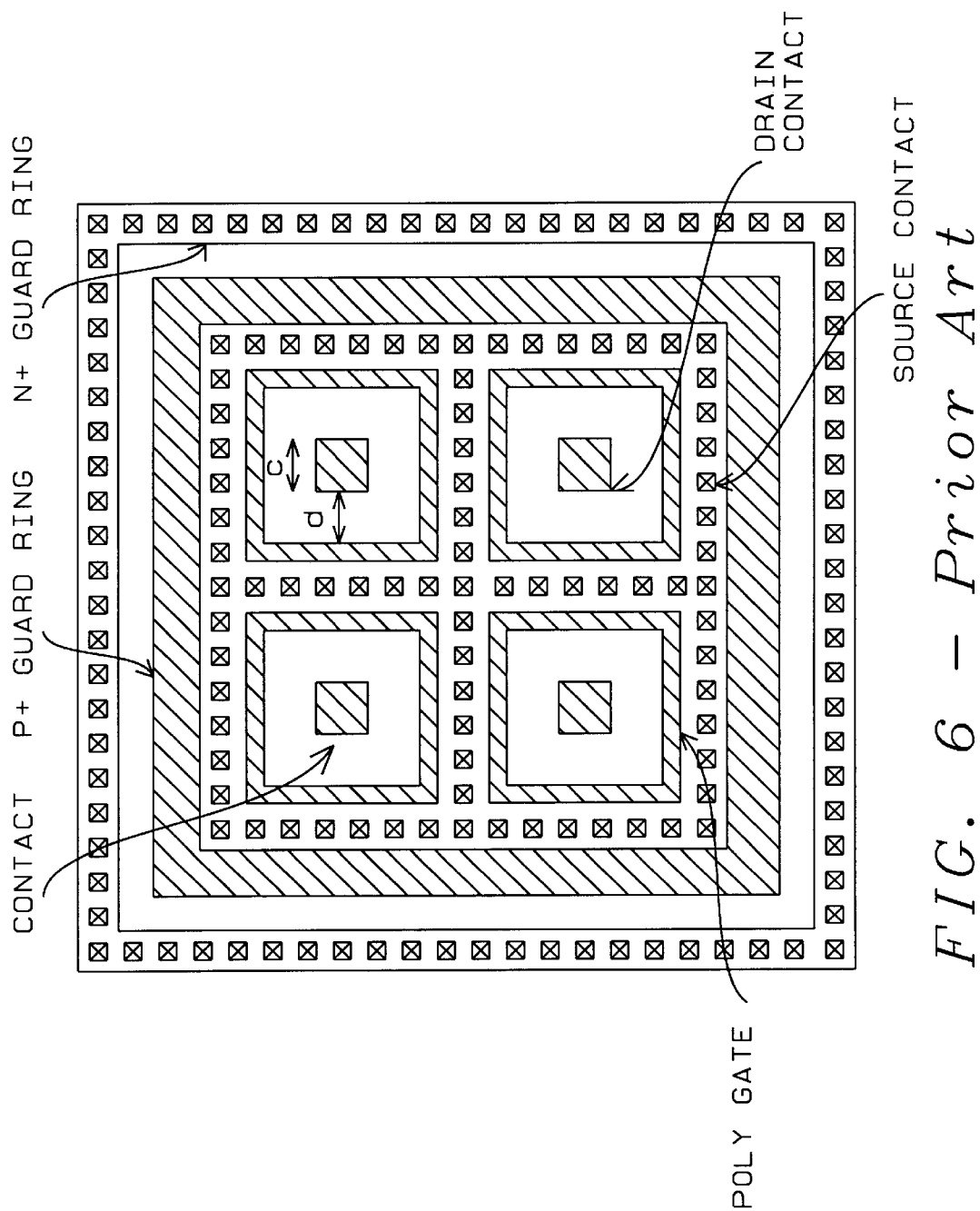
FIG. 6 is a layout plot of four small-dimension square cells forming a large-dimension NMOS device shown, which is used to realize an MOS prior art device.
Figure 7:
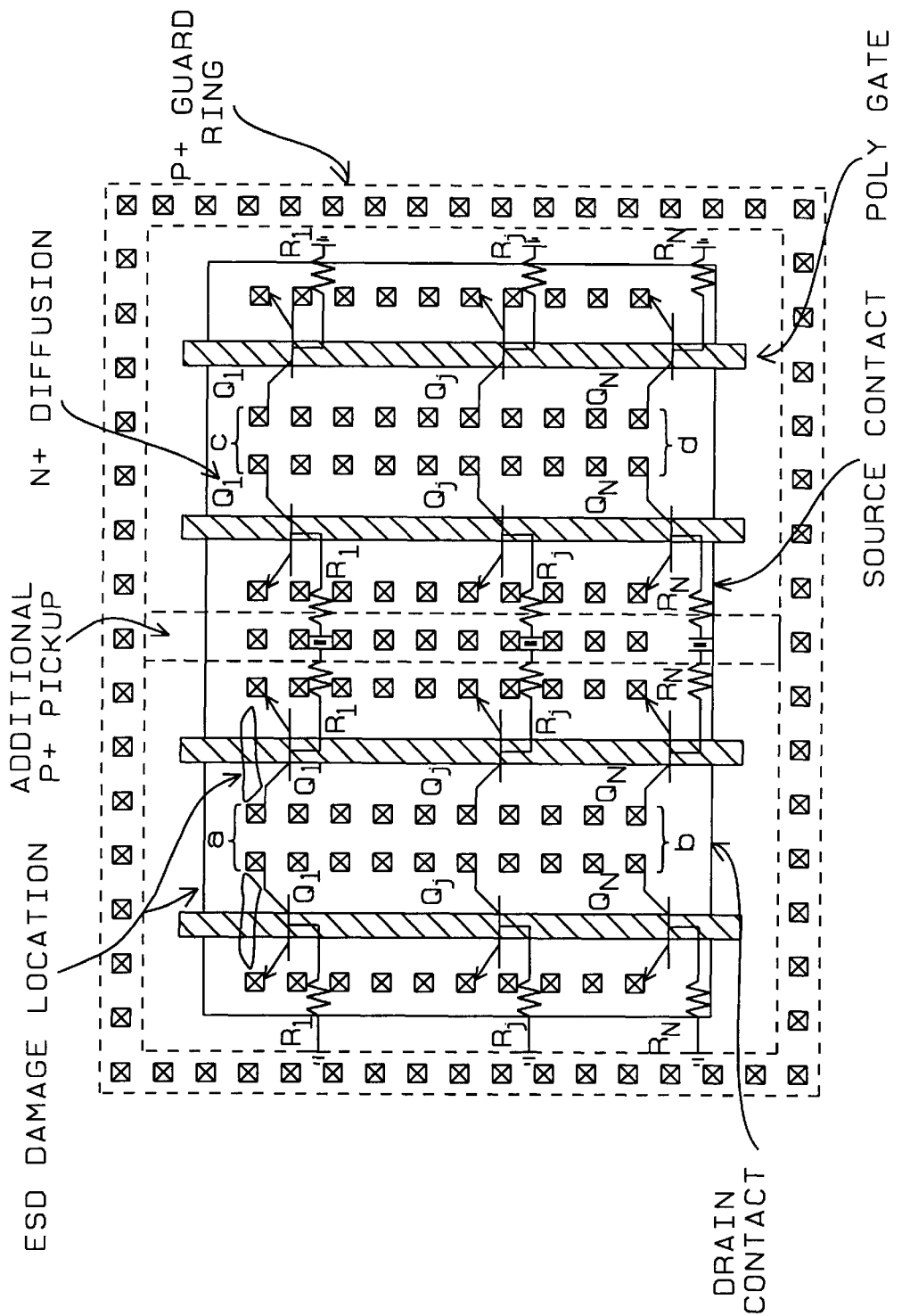
FIG. 7 shows parasitic lateral n-p-n BJT devices of a prior art multiple-finger ESD-protection NMOS transistor device.
Figure 8:
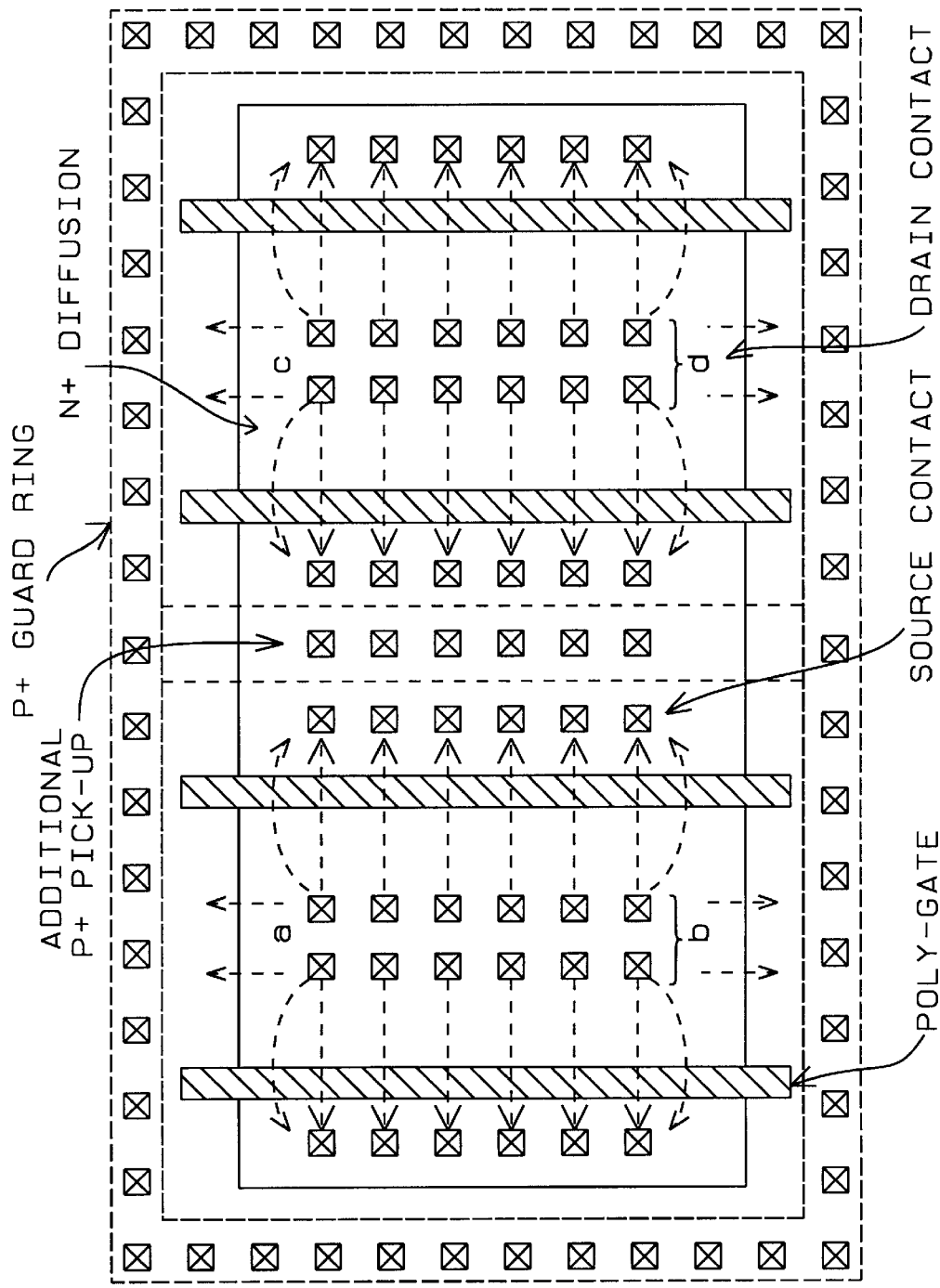
FIG. 8 is an illustration showing the peak-discharging effect on the finger-type MOS transistor showing the distribution of the current path of a prior art ESD-protection NMOS transistor device.

In the traditional layout style, the BJT devices $Q_1$ and $Q_N$ in FIG. 7 were triggered on first in the ESD overstress and damage was found at the drain contacts near these BJT devices.

By using the layout style of this invention, the base width of $Q_1$ and $Q_N$ in FIG. 9 is larger (wider) than that of $Q_j$. Therefore, the current gain β of $Q_1$ and $Q_N$ is less than that of $Q_j$. BJT $Q_1$ and BJT $Q_N$ will not be triggered on before other BJT devices are turned on in the ESD overstress condition. Therefore, the BJT devices of the MOS transistors will be triggered on more uniformly to improve the ESD robustness of the MOS transistors, especially in the machine-model ESD stress. This layout style can be also applied to the PMOS device or a field-oxide device to improve their ESD level.

B. Application of this Invention:

The following description pertains to examples which demonstrate the application of this invention.

Figure 10:
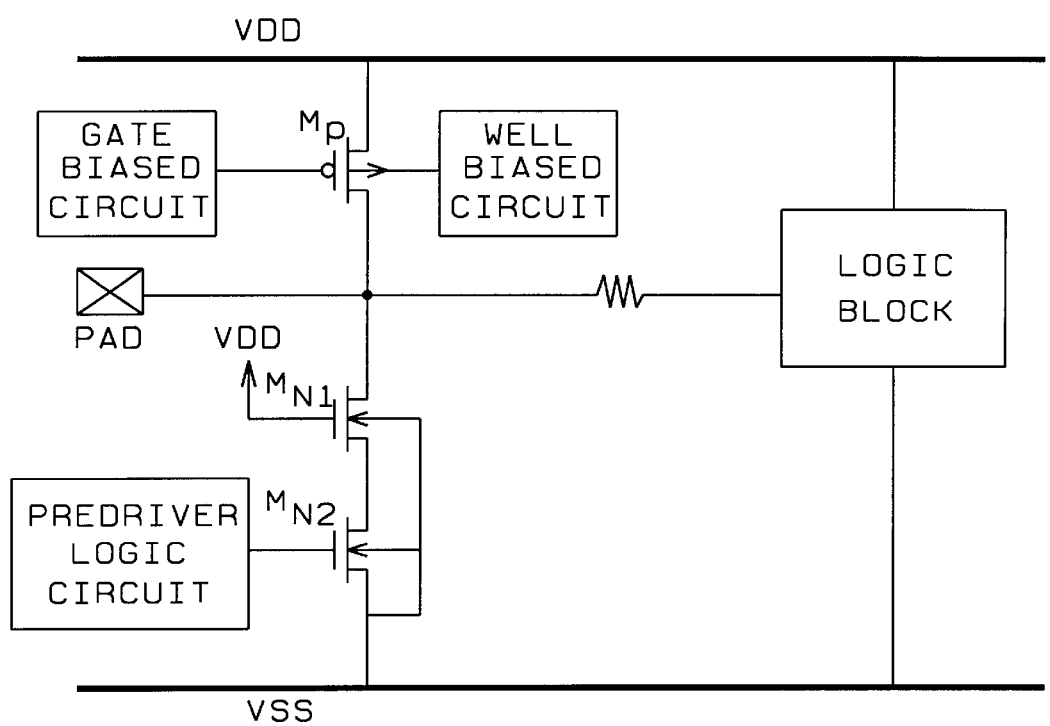
FIG. 10 is a schematic diagram of a high-voltage-tolerant circuit with stacked NMOS transistors implemented in this circuit to prevent an overstress voltage across the MOS junctions, while the IC is in normal operation condition.

FIG. 10 is a schematic diagram of the high-voltage-tolerant circuit. The stacked NMOS transistors must be implemented in this circuit to prevent the overstress voltage across the MOS gate oxides, while the IC is in normal operation condition. Among these two NMOS transistors, the gate of the inner one MN1 should be connected to VDD. The inner NMOS transistor MN1 is always turned on during the normal operation. The outer NMOS transistor MN2 is used to drive the I/O pad. The gate of outer NMOS transistor MN2 is connected to a predriver logic circuit. The output NMOS transistor Mp is connected between VDD and PAD. The gate of transistor Mp is connected to a gate biased circuit, which is used to control the voltage of a gate in a high voltage input condition. The bulk of transistor Mp is connected to a well biased circuit, which is used to control the voltage of the N-well in high voltage input condition. The output PMOS transistor Mp and the output NMOS transistors MN1 and MN2 are also working as ESD protection devices for the I/O pads.

Figure 11:
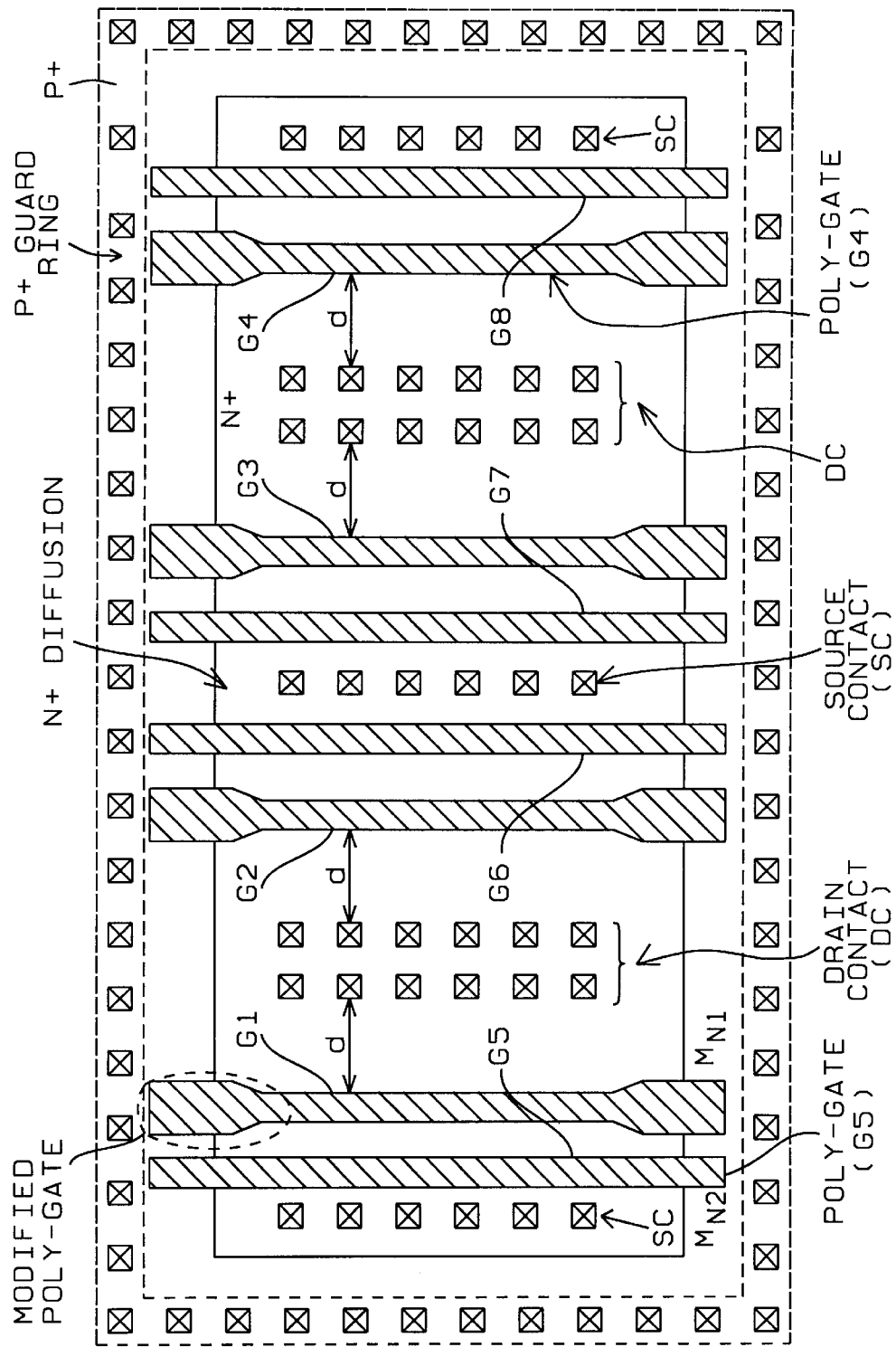
FIG. 11 shows a two level arrangement of polysilicon gate ends which are shown in a layout style of NMOS transistors in the high-voltage-tolerant circuit implemented by the modified polysilicon-gate technique of this invention.

FIG. 11 shows a two level arrangement of polysilicon gate ends which are shown in a layout style of NMOS transistors in the high-voltage-tolerant circuit implemented by the modified polysilicon-gate technique of this invention. Gate G1 is a part of the inner NMOS transistor MN1, while gate G5 is a part of the outer NMOS transistor MN2. Gate G5 is a narrow gate located to the left of gate G5. Gate G8 is a narrow gate located to the right of gate G4. Gate G6 is located between gate G2 and the central source contacts SC. Gate G7 is located between gate G3 and the central source contacts SC. Only the poly-silicon-gate G1 of inner transistor MN1 is required to be modified for improving the ESD level of this circuit, because inner NMOS transistor MN1 is on the drain side and outer NMOS Transistor MN2 is on the source side. In the layout of the ESD clamp MOS, we know that the design para-meters of the distance of the drain contacts DC to the edge of the polysilicon-gates G1, G2, G3 and G4 which is marked as 'd' for gate G1 in FIG. 11, is very important. The ESD robustness will be improved by increasing that distance 'd'. But this approach pays the penalty of increasing the layout area of silicon. By the new layout style of this invention, the turn-on uniformity of the MOS transistor is improved, therefore the distance 'd' can be reduced to save the layout area. At the same time, the ESD performance is improved. As in FIG. 9, the polysilicon-gates G1, G2, G3 and G4 have the widened dog-bone distal shape with the ends of the polysilicon-gates G1, G2, G3 and G4 being wider than the central portions thereof inside the active region as defined by the border 9 (as marked in FIG. 9)of the N+ doped active region. On the other hand, the polysilicon-gates G5, G6, G7 and G8, which are juxtaposed with and aligned in parallel with source contact rows SC, are narrow from top to bottom and are not flared out into dog-bone shape are the periphery of the N+ doped active region. In addition, the polysilicon-gates G5, G6, G7 and G8 are sandwiched between and parallel with polysilicon-gates G1, G2, G3 and G4 and source contact rows SC.

Figure 12:
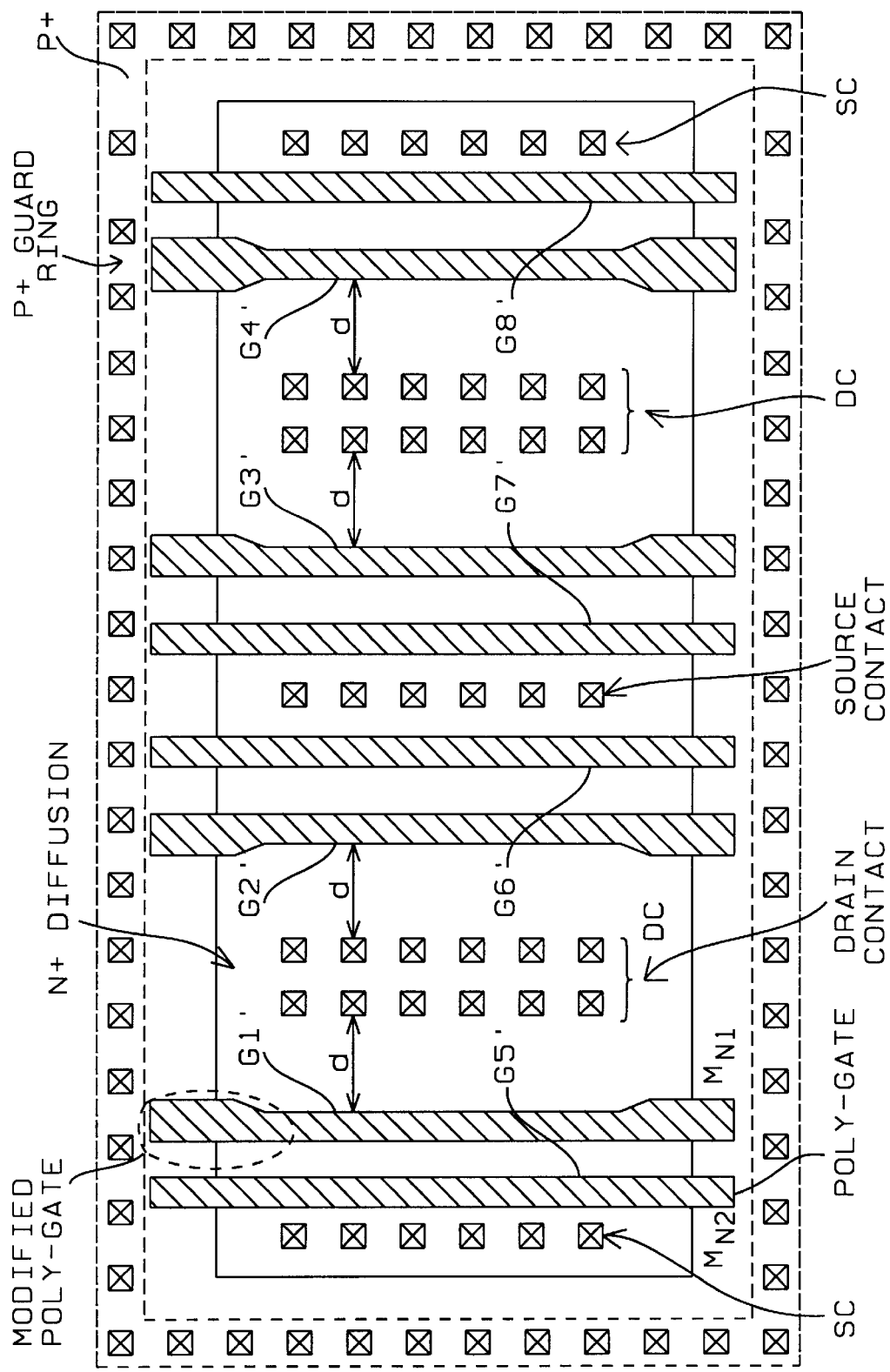
FIG. 12 shows a further modification to the layout in FIG. 11 that was made in order to reduce the layout area of the ESD-protection devices in the high-voltage-tolerant circuit.

FIG. 12 shows a further modification to the layout in FIG. 11 that was made in order to reduce the layout area of the ESD-protection devices in the high-voltage-tolerant circuit.

In FIG. 12, there are asymmetric ends formed on the polysilicon-gate G1' in transistor $M_{N1}$ which are only extended (widened) at the drain side. On the source side, the width of polysilicon-gate G1' of transistor $M_{N1}$ is kept the same. Because the peak-discharging effect is only significant in the drain region, the polysilicon-gates G5', G6', G7' and G8' near the source region of contacts SC can be kept as it was. In this condition, the ESD performance of this circuit is similar to that of FIG. 11 and the layout area can be more compact. By this implementation, the design parameter 'd' can be reduced to improve the layout area efficiency. The design parameter 'd' can be reduced because of the turn-on uniformity of the parasitic lateral n-p-n BJT devices of NMOS transistor.

The concept of modified polysilicon-gate design can be applied to PMOS devices. To apply this concept to PMOS devices, the process cost can be reduced by dropping the process step of ESD implant. By reducing the corner effects, the ESD performance of ESD clamp PMOS can be improved.

Figure 13:
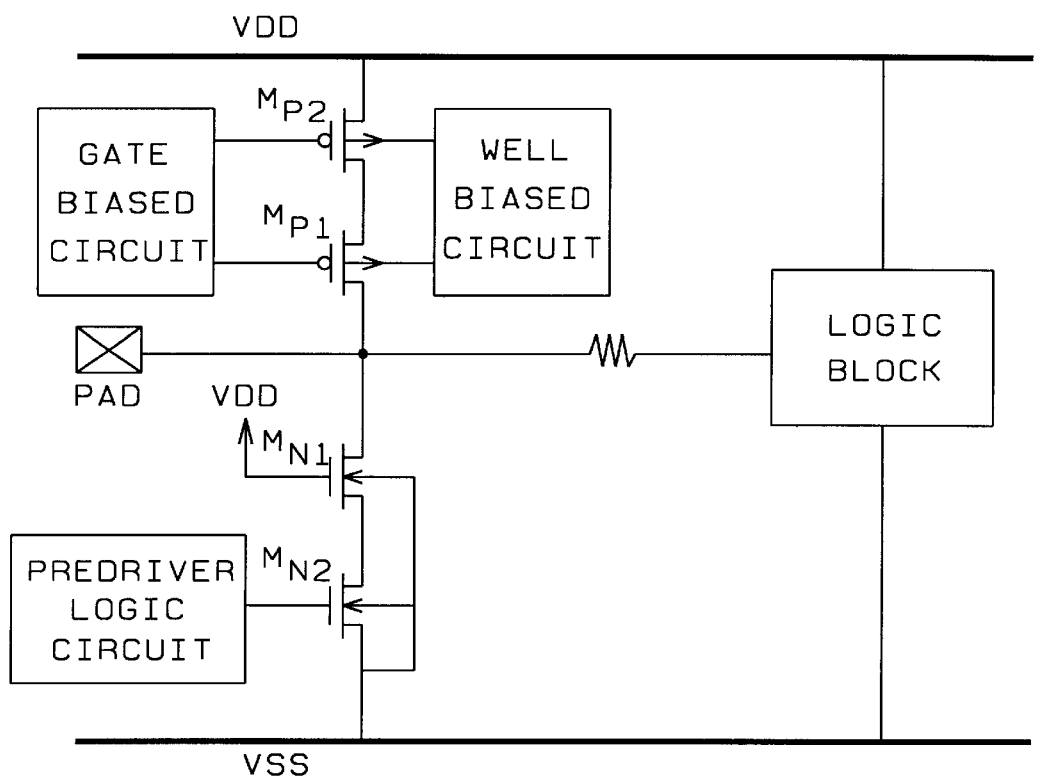
FIG. 13 shows a schematic diagram of another high-voltage-tolerant I/O structure with stacked PMOS with a stacked PMOS structure is implemented instead of the single MOS transistor structure in FIG. 10.

The schematic diagram of another high-voltage-tolerant I/O structure with stacked PMOS is shown in FIG. 13. In this structure, the stacked PMOS structure is implemented instead of the single MOS transistor structure in FIG. 10. However, the gate biased circuit and the well biased circuit are also required in this structure for function of high-voltage-tolerant. The layout style of the polysilicon-gates of this invention can be applied to the stacked PMOS structure in FIG. 13 in order to improve the ESD robustness of the devices and reduce the layout area.

Figure 14:
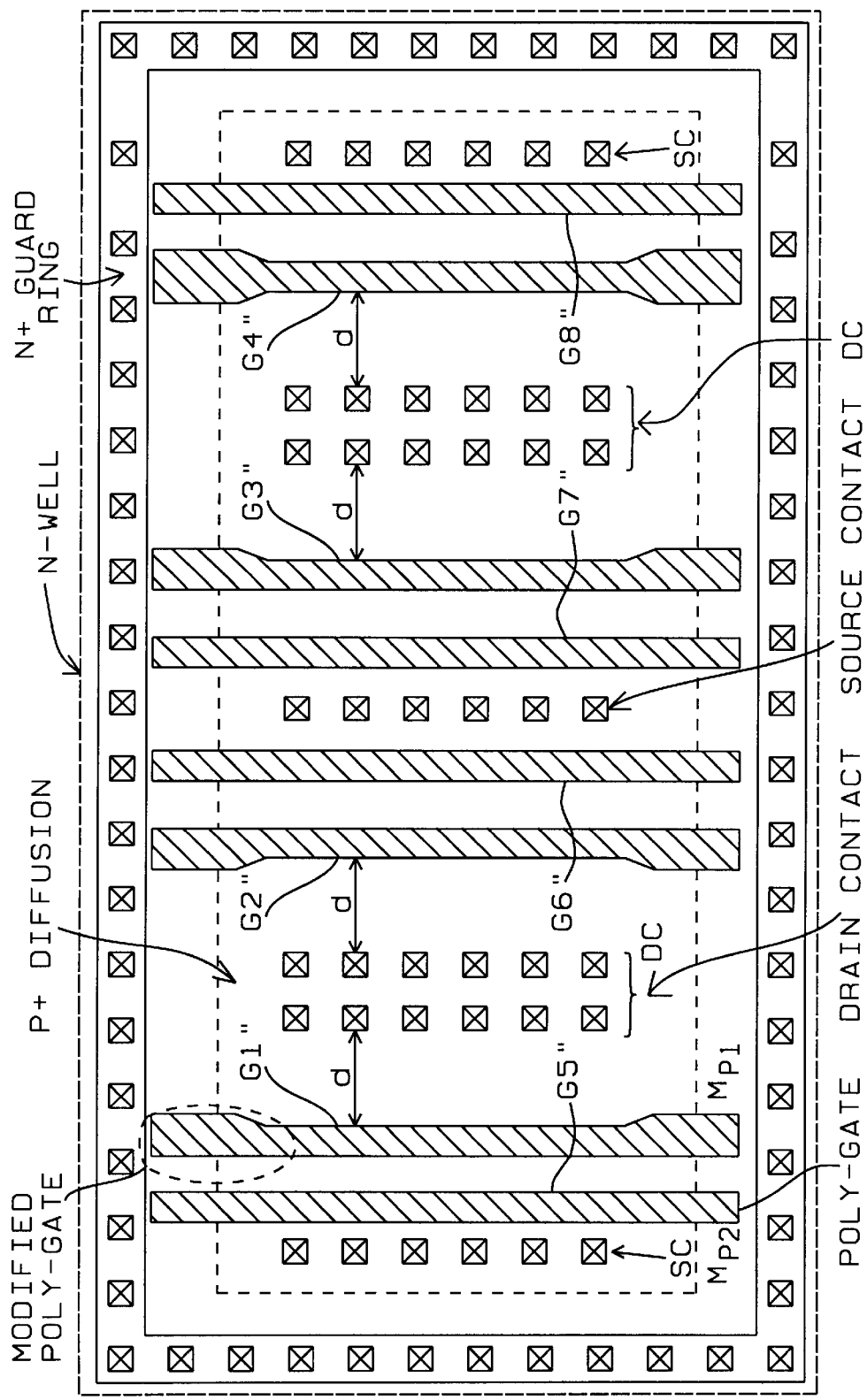
FIG. 14 is an illustration of the layout of a stacked PMOS structure designed in accordance with this invention in which for area efficiency concerns, only the edge of the polysilicon-gates near the drain contact is modified.

FIG. 14 is an illustration the layout of a stacked PMOS structure. For area efficiency concerns, only the edge of the polysilicon-gates near the drain contact is modified. In this layout style, the MOS transistor can be triggered on more uniformly, and thus the ESD robustness of the PMOS transistors can be enhanced. Therefore, the layout style of this invention is useful not only for NMOS devices but also for PMOS devices. It is a very efficient approach to improvement of ESD performance.

By applying the layout style of this invention of ESD-protection MOS transistors, the ESD robustness of the ESD protection circuit can be improved. The layout styles of polysilicon-gates are modified to reduce the phenomenon of damages located at the ends of the poly-gates. For applying this invention to the ESD protection circuit, the ESD level will be increased and the layout area of silicon can be reduced. For applying PMOS as the ESD device, the process cost can be reduced by skipping the ESD implant process step.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming ESD-protection MOS transistors with an active region comprising:
    forming gate electrodes of the ESD-protection MOS transistors with the gate electrodes being of uniform narrow width across the entire active region aside from the periphery thereof, and
    forming gate electrodes with wider ends at the periphery of the active region,
    whereby the transistors have improved turn-on uniformity.

2. The method of claim 1 wherein the ESD protection transistors are NMOS transistors and PMOS transistors.

3. The method of claim 1 wherein source contacts and drain contacts for transistors are located inboard of the periphery of the active region leaving space for the wider ends of the gate electrodes at the periphery of the active region.

4. The method of claim 1 wherein the active region has peripheral boundaries, and the wider ends of the gate electrodes straddle the peripheral boundaries of the active region.

5. The method of claim 1 including:
    forming inner NMOS transistors and outer NMOS transistors and inner PMOS transistors and outer PMOS transistors in high-voltage-tolerant I/O circuits, and
    forming the wider ends on only the inner NMOS transistors and the inner PMOS transistors.

6. A method of forming a layout for ESD-protection MOS transistors comprising:
    forming gate electrodes of the ESD-protection MOS transistors with an active region having peripheral boundaries, and with the gate electrodes being of uniform narrow width in the active region aside from the periphery thereof, and
    forming some of the gate electrodes with asymmetric wider ends at the periphery of the active region,
    whereby the transistors have improved turn-on uniformity.

7. The method of claim 6 wherein the ESD protection transistors are NMOS transistors and PMOS transistors.

8. The method of claim 6 wherein source contacts and drain contacts for the transistors are located inboard of the periphery of the active region leaving space for the wider ends of the gate electrodes.

9. The method of claim 6 wherein the wider ends of the gate electrodes straddle the peripheral boundaries of the active region.

10. The method of claim 6 wherein a modified layout style is provided for inner and outer NMOS transistors and PMOS transistors in the high-voltage-tolerant I/O circuits with the wider ends being provided on only the inner NMOS transistors and PMOS transistors.

11. A layout form of ESD-protection MOS transistors comprising gate electrodes of the ESD-protection MOS transistors formed with the gate electrodes being of uniform narrow width in an active region thereof aside from the periphery thereof, and
    some of the gate electrodes having wider ends at the periphery of the active region,
    whereby the transistors have improved turn-on uniformity.

12. The layout of claim 11 wherein the ESD protection transistors are NMOS transistors and PMOS transistors.

13. The layout of claim 11 wherein source contacts and drain contacts for transistors are located inboard of the periphery of the active region leaving space for the wider ends of the gate electrodes.

14. The layout of claim 11 wherein the active region has peripheral boundaries, and the wider ends of the gate electrodes straddle the peripheral boundaries of the active region.

15. The layout of claim 11 wherein a modified layout style is provided for inner and outer NMOS transistors and PMOS transistors in the high-voltage-tolerant I/O circuits with the wider ends being provided on only the inner NMOS transistors and PMOS transistors.

16. A layout form ESD-protection MOS transistors comprising:
    gate electrodes of the ESD-protection MOS transistors formed with an active region having peripheral boundaries,
    the gate electrodes being of uniformly narrow width in the active region aside from the periphery thereof, and
    some of the gate electrodes having asymmetric wider ends at the periphery of the active region,
    whereby the transistors have improved turn-on uniformity.

17. The layout of claim 16 wherein the ESD protection transistors are NMOS transistors and PMOS transistors.

18. The layout of claim 16 wherein source contacts and drain contacts for the transistors are located inboard of the periphery of the active region leaving space for the wider ends of the gate electrodes.

19. The layout of claim 16 wherein the wider ends of the gate electrodes straddle the peripheral boundaries of the active region.

20. The layout of claim 16 wherein a modified layout style is provided for inner and outer NMOS transistors and PMOS transistors in the high-voltage-tolerant I/O circuits with the wider ends being provided on only the inner NMOS transistors and PMOS transistors.

21. A layout form of ESD-protection MOS transistors comprising:
    an active region with parallel rows of contacts including source contacts, the rows of source contacts and drain contacts for the transistors being located inboard of the periphery of the active region, with pairs of rows of drain contacts formed adjacent,
    gate electrodes of the ESD-protection MOS transistors formed parallel with the rows of contacts with the gate electrodes being of uniformly narrow width in an active region thereof aside from the periphery thereof, and some of the gate electrodes having wider ends at the periphery of the active region, whereby the transistors have improved turn-on uniformity.

22. The layout of claim 21 wherein the gate electrode proximate to rows of source contacts have narrow ends at the periphery of the active region and the gate electrodes proximate to rows of drain contacts have widened ends at the periphery of the active region.

23. The layout of claim 21 wherein the gate electrode proximate to rows of source contacts have narrow ends at the periphery of the active region and the gate electrodes proximate to rows of drain contacts have widened ends at the periphery of the active region only on the sides proximate to the rows of drain contacts.

* * * * *